(12) United States Patent
Sander (10) Patent No.: US 6,219,394 B1
(45) Date of Patent: *Apr. 17, 2001

(54) DIGITAL FREQUENCY SAMPLING AND DISCRIMINATION

(75) Inventor: Wendell Sander, Los Gatos, CA (US)

(73) Assignee: Tropian, Inc., Cupertino, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/947,027

(22) Filed: Oct. 8, 1997

(51) Int. Cl.[7] ..................................................... H04L 7/00
(52) U.S. Cl. ............................................. 375/355; 327/45
(58) Field of Search .................................. 375/354, 377, 375/355; 327/45, 113, 115, 117, 144, 145, 48

(56) References Cited

U.S. PATENT DOCUMENTS

| | | | |
|---|---|---|---|
| 4,468,794 | 8/1984 | Waters et al. | 375/103 |
| 4,527,145 | 7/1985 | Haussmann et al. | 358/19 |
| 4,764,923 | 8/1988 | Forth et al. | 371/6 |
| 5,398,007 | * 3/1995 | Ymazaki et al. | 331/46 |
| 5,398,029 | * 3/1995 | Toyama et al. | 341/61 |
| 5,513,209 | * 4/1996 | Holm | 375/354 |
| 5,557,647 | * 9/1996 | Kushige et al. | 375/355 |
| 5,615,235 | * 3/1997 | Kakuishi et al. | 375/355 |
| 5,664,165 | * 9/1997 | Curry et al. | 395/556 |
| 5,796,995 | * 8/1998 | Nasserbakht et al. | |

OTHER PUBLICATIONS

Hovin et al., "Delta–Sigma Modulators Using Frequency–Modulated Intermediate Values", *IEEE Journal of Solid–State Circuiuts,* 32:1, pp. 13–22 (1997).

Hovin et al., "A Narrow–Band Delta–Sigma Frequency–to–Digital Converter", IEEE International Symposium on circuits and Systems, pp. 77–80 (1997).

Hovin et al., "Novel second–order $\Delta$–$\Sigma$ modulator/frequency–to–digital converter", *Electronics Letters,* 31:2, pp. 81–82 (1995).

* cited by examiner

Primary Examiner—Chi Pham
Assistant Examiner—Jean B Corrielus (57) ABSTRACT

The present invention, generally speaking, provides a very simple, all-digital method and apparatus for determining the ratio of frequencies of two signals. One of the signal may be a known reference frequency, allowing the instantaneous frequency of an unknown input signal to be readily determined. A frequency sampling technique is employed that produces a stream of digital bits which contains information regarding the ratio of frequencies. From the stream of digital bits is formed a digital word indicative of the ratio of frequencies. The digital word may be formed using a digital filter. Advantageously, an extensive body of digital filtering techniques applicable to Sigma-Delta (sometimes referred to as Delta-Sigma) A/D converters may be applied directly to the digital stream. By using an appropriately-chosen weighting function, high accuracy may be obtained.

6 Claims, 7 Drawing Sheets

DIGITAL FREQUENCY SAMPLING AND DISCRIMINATION

BACKGROUND OF THE INVENTION

1. Field of the Invention

The present invention relates to digital frequency discrimination.

2. State of the Art

Frequency discrimination is important in digital radio communications, in particular in any digital FM radio receiver. Frequency discrimination is typically performed using analog circuitry, e.g. an IQ frequency discriminator. Analog frequency discriminators have substantial drawbacks. In the case of an IQ frequency discriminator, the discriminator requires a number of analog components, two A/D conversions and a numerical arctangent operation, rendering the circuit quite complex.

Known methods exist for producing a value representing the instantaneous frequency of a signal using only digital logic elements. Various such methods are described in U.S. Pat. No. 5,084,669, incorporated herein by reference. In particular, the foregoing patent describes a digital circuit for determining the instantaneous phase of a signal, from which the instantaneous frequency may be obtained if desired. Although the implementation of the circuit is all digital, it is quite involved. An improved method and apparatus for determining in a simple, all-digital manner the instantaneous frequency of a signal would therefore likely be well-received by those skilled in the art.

SUMMARY OF THE INVENTION

The present invention, generally speaking, provides a very simple, all-digital method and apparatus for determining the ratio of frequencies of two signals. One of the signals may be a known reference frequency, allowing the instantaneous frequency of an unknown input signal to be readily determined. A frequency sampling technique is employed that produces a stream of digital bits which contains information regarding the ratio of frequencies. From the stream of digital bits is formed a digital word indicative of the ratio of frequencies. The digital word may be formed using a digital filter. Advantageously, an extensive body of digital filtering techniques applicable to Sigma-Delta (sometimes referred to as Delta-Sigma) A/D converters may be applied directly to the digital stream. By using an appropriately-chosen weighting function, high accuracy may be obtained.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The approach followed by the digital frequency discriminator of the present invention may be appreciated by analogy to Sigma-Delta A/D conversion, well-documented in the prior art by such references as "Oversampling Delta-Sigma Data Converters", Candy, et al., IEEE Press, pages 1–6, Piscataway, N.J. (1992). A Sigma-Delta converter modulates a varying-amplitude analog input signal into a simple digital code at a frequency much higher than the Nyquist rate. The design of the modulator allows resolution in time to be traded for resolution in amplitude. A sampled-data circuit model of a Sigma-Delta modulator, shown in FIG. 1, may be directly applied to frequency sampling as described herein.

Figure 1:
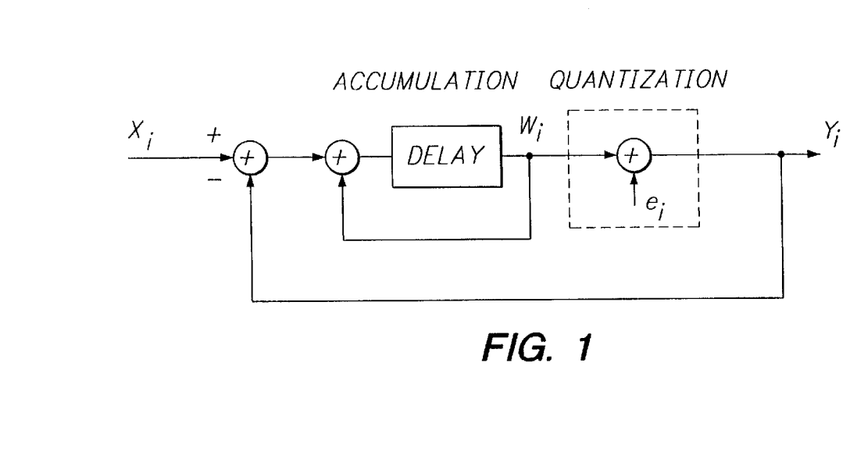
FIG. 1 is a block diagram illustrating a sampled-data model of a Sigma-Delta modulator and of a sampling circuit applied to frequency sampling in accordance with one embodiment of the present invention.

Referring to FIG. 1, an input signal $x_i$ occurring at sample time i has subtracted from it the output signal $y_i$ at sample time i. The result is applied to an accumulator having an output signal $w_i$. A "new" input signal of the accumulator at sample time i is combined with the "old" output signal of the accumulator to form a new output signal of the accumulator. The output signal of the accumulator is quantized, the quantization being represented as the addition of an error $e_i$. The output signal of the quantizer is the final output signal $y_i$.

Figure 2:
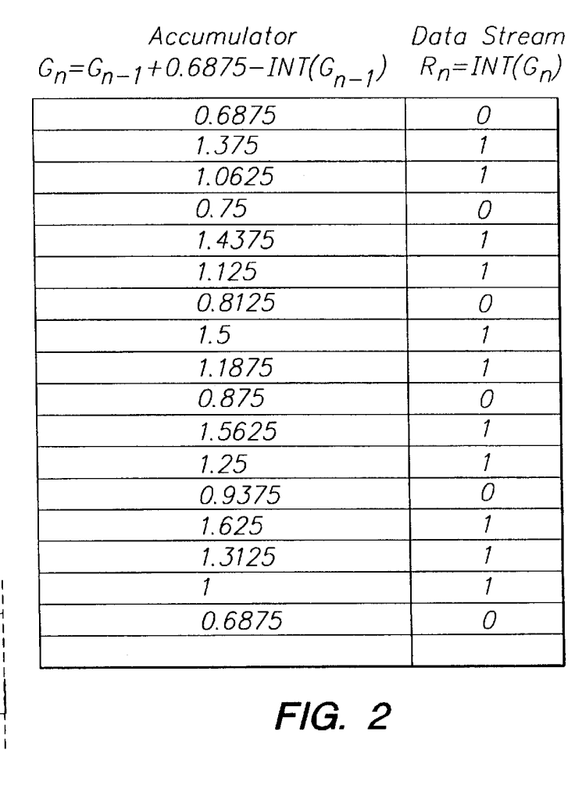
FIG. 2 is a table helpful in explaining operation of the circuit model of FIG. 1 in the instance of an input frequency that is 0.6875 times a reference frequency.

Assume now that $x_i$ is the ratio of two frequencies and that the quantizer is a two-level quantizer. Further assume that the ratio of the two frequencies for the time period in question is, say, 0.6875. As shown in FIG. 2, the latter value is accumulated a first time, giving an accumulated value of 0.6875. This valuing being less than 1, the value 0.6875 is again added to the accumulated value, giving a new accumulated value of 1.375. Since this value is now greater than 1, 1 is subtracted from 0.6875 and the result (0.6875−1=− 0.3125) added to the accumulator to give a value of 1.0625. Operation proceeds in this fashion. During the foregoing sequence of operations, a data stream is produced by taking the integer portion, 1 or 0, of each accumulated value.

Figure 3:
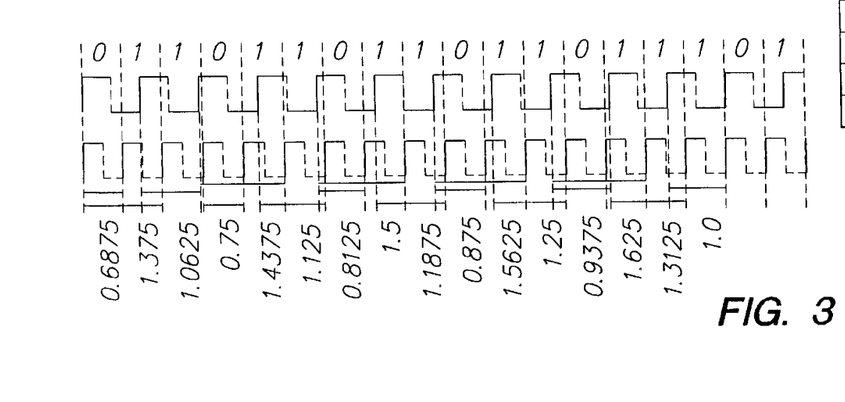
FIG. 3 is a timing diagram illustrating the principle of operation of the circuit model of FIG. 1 as applied to frequency sampling.

Referring to FIG. 3, the interpretation of the sequence of numbers shown in FIG. 2 may be appreciated. Two clock signals are shown. Again, it is assumed that the ratio of the frequency of the upper clock signal to that of the lower clock signal during the period of interest is 0.6875. At time t=0, rising edges of both clock signals coincide. At the first subsequent rising edge of the lower clock signal, 0.6875 periods of the upper clock signal have elapsed. At the next rising edge of the lower clock signal, 1.375 periods of the upper clock signal have elapsed. At the next rising edge of the lower clock signal, 1.0625 periods of the upper clock signal have elapsed since the elapse of the first period of the upper clock signal, and so on.

Figure 4:
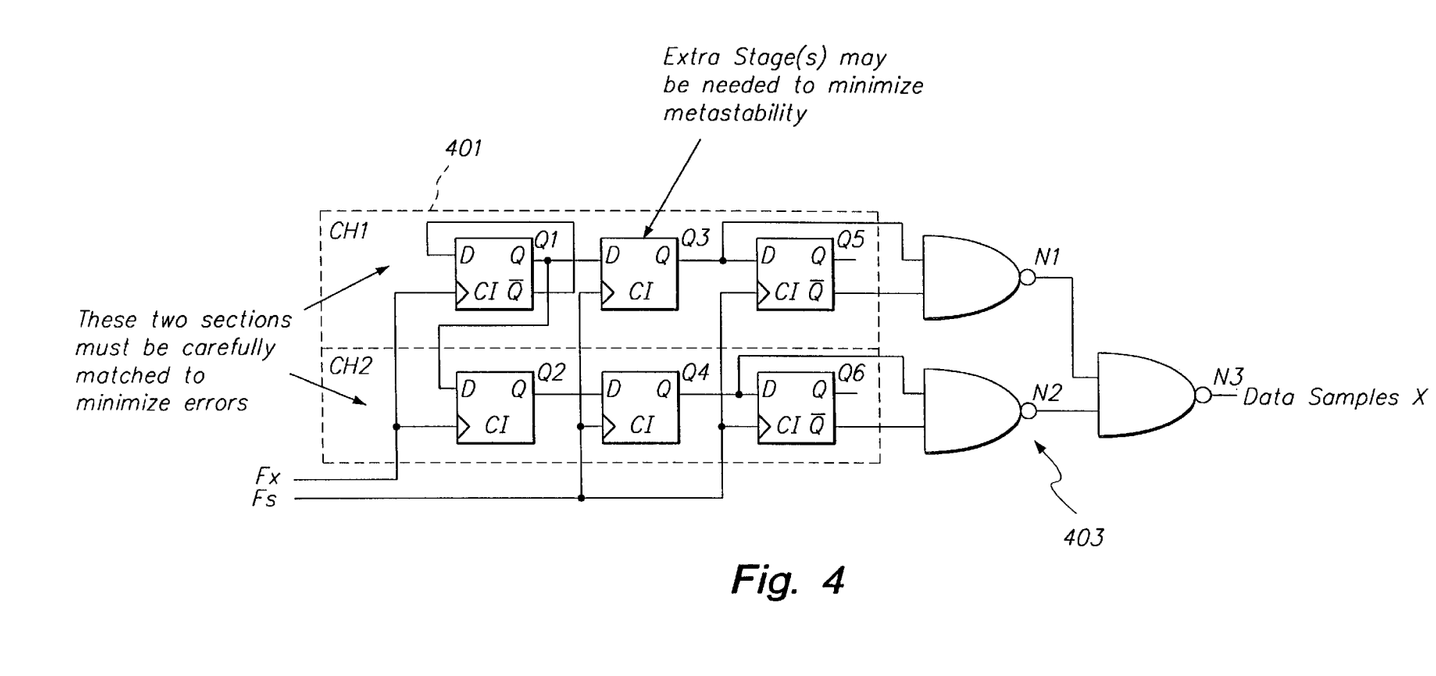
FIG. 4 is a schematic diagram of one example of a frequency sampling circuit described by the circuit model of FIG. 1.

A schematic diagram of a capture circuit,. or frequency sampling circuit, that may be used to data samples corresponding to the data stream described in the foregoing example is shown in FIG. 4. In the illustrated embodiment, it is assumed that the ratio of the clock signals is such that no more than one rising edge of the faster clock will occur during a single period of the slower clock. In other embodiments, this assumption need not apply.

The capture circuit includes a input portion 401 and an output portion 403. The input portion includes two sections Ch1 and Ch2 that must be carefully matched to minimize errors. Each section comprises a chain of two or more D flip-flops coupled in series. In the following description, the same reference numerals will be used to reference the respective flip-flops themselves and their respective output signals.

Within each section, the first flip-flop in the chain is clocked by a sampled clock signal Fx. The succeeding flip-flops in the chain are clocked by a sampling clock signal Fs. The D input of the first flip-flop Q1 in the upper section is coupled to the $\overline{Q}$ output of the same. The D input of the first flip-flop in the lower section is coupled to the Q output of the first flip-flop in the upper section. The remaining flip-flops in both sections are coupled in series—i.e., Q to D, Q to D.

The function of the input portion is to 1) produce two signals, logical inverses of one another, that transition on rising edges of the clock signal Fx; 2) to latch the values of the two signals on the rising edge of the clock signal Fs; and 3) to detect transitions from one clock to the next. Additional intermediate stages in series with Q3 and Q4 may be required to minimize metastability resulting from the asynchrony of the two clock signals, and in fact multiple such stages may be desirable in a particular design.

The output portions include, in an exemplary embodiment, three two-input NAND gates. Respective NAND gates N1 and N2 are coupled to the D and $\overline{Q}$ signal of the final flip-flop stages of the input sections. Output signals of the NAND gates N1 and N2 are combined in the further NAND gate N3 to form the final output of the capture circuit.

The function of the output portion is to detect a change in the input clock signal level from one sample clock to the next in either of two channels formed by the two input sections. The two input sections function in a ping-pong fashion, alternately detecting changes in the input clock signal level.

Figure 5:
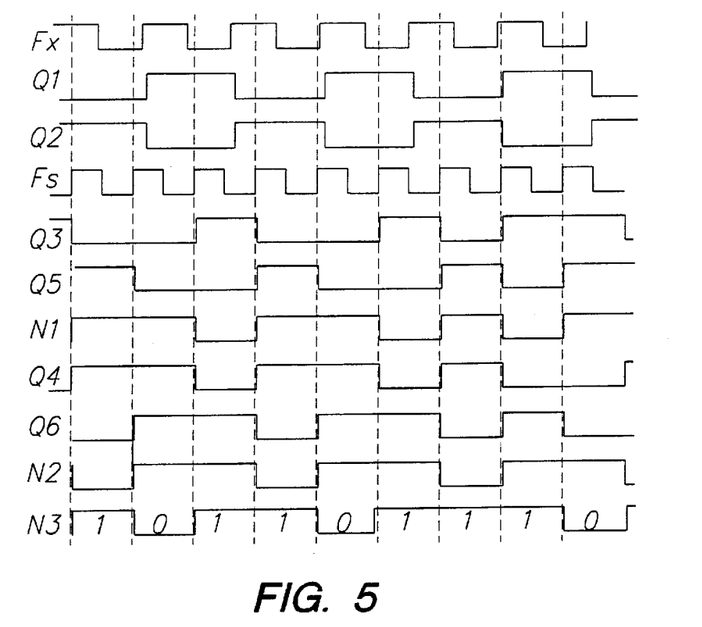
FIG. 5 is a first timing diagram illustrating operation of the frequency sampling circuit of FIG. 4.

Operation of the capture circuit of FIG. 4 may be more fully appreciated with reference to the timing diagram of FIG. 5. The first stages of the two channels form inverse signals Q1 and Q2 approximately coincident with (but slightly delayed from) rising edges of the input clock signal. The signals Q3 and Q4 are formed by sampling the signals Q1 and Q2, respectively, in accordance with the sample clock. The signals Q5 and Q6, respectively, are delayed replicas of the signals Q3 and Q4. The NAND gates together realize the logic function X=Q3·$\overline{Q5}$ v Q4·$\overline{Q6}$.

Figure 6:
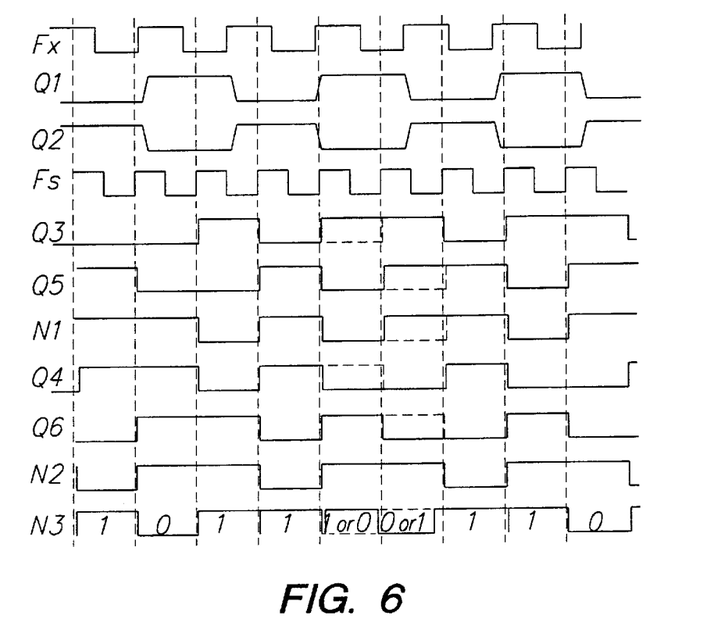
FIG. 6 is a second timing diagram illustrating operation of the frequency sampling circuit of FIG. 4.

In the example of FIG. 5, the illustrated signals are all idealized square-wave signals. In actuality, the signals will have finite rise and fall times. The possible effect of the finite rise and fall times of the signals Q1 and Q2 and the asynchrony of the circuit is metastability, as illustrated in FIG. 6. Here, the signals Q3 and Q5 and the signals Q4 and Q6 are each in an indeterminate state for one cycle. The resulting output of the circuit may or may not be correct. However, because the decision was a "close call" to begin with, the effect of an occasional erroneous decision on the overall operation of the circuit is negligible. The time window of instability is reduced by increasing the overall gain in the path. If the gain in Q3 and Q9 is sufficient to reduce the probability of an error to an acceptable level, then no additional circuitry is required. If not, then additional circuitry will be required to increase the gain.

In order to recover the ratio of the frequencies of the two clock signals from the data stream produced by a capture circuit such as the one of FIG. 4, digital filtering is applied. Advantageously, an extensive body of digital filtering techniques applicable to Sigma-Delta (or Delta-Sigma) A/D converters may be applied directly to the digital stream. Furthermore, by using an appropriately-chosen weighting function, high accuracy may be obtained.

The weighted sum of products is an example of an FIR filter. The weighting function described heretofore is therefore that of an FIR filter in digital filtering theory. It should be recognized, however, that FIR filters can also be used. In the process of digital filtering, the weighting function is applied to a "window" of data samples to obtain an estimate of the ratio of frequencies in the center of the window. The window is then "picked up and moved" to the next sequence of samples. Windowing will typically overlap. A window may include 256 samples, for example.

Figure 7:
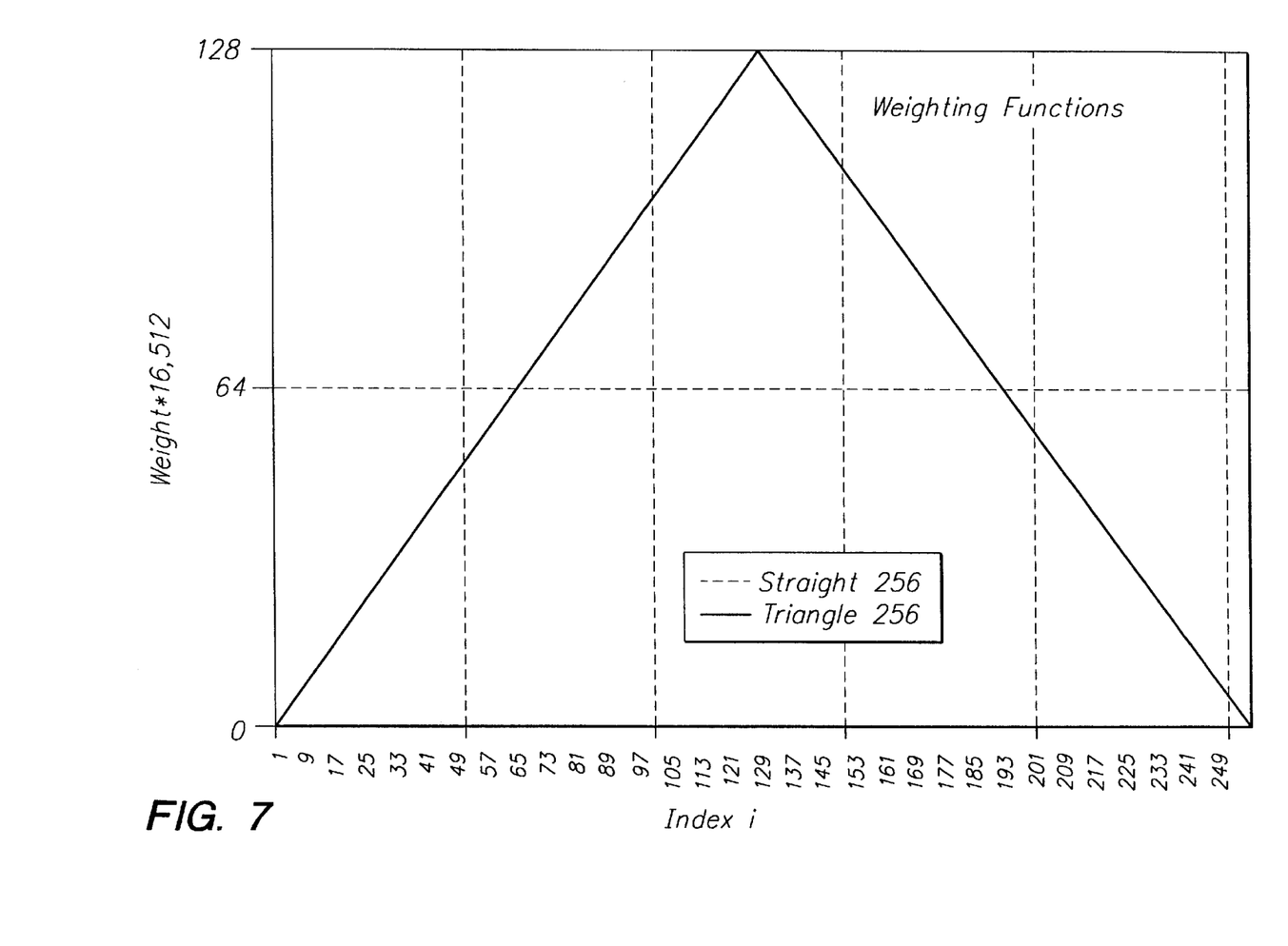
FIG. 7 is a graph of two alternative weighting functions that may be used to perform digital filtering of a digital bit stream produced by a circuit such as that of FIG. 4.

Referring to FIG. 7, two alternative weighting functions are shown for a window of 256 samples. The weighting functions are normalized, meaning that the area under the weighting function is unity. One weighting function, indicated in dashed lines, is a straight-line, constant weighting function. Another weighting function, indicated in solid line, is a triangular weighting function. The weighting function is the impulse response function in digital filters.

Figure 8:
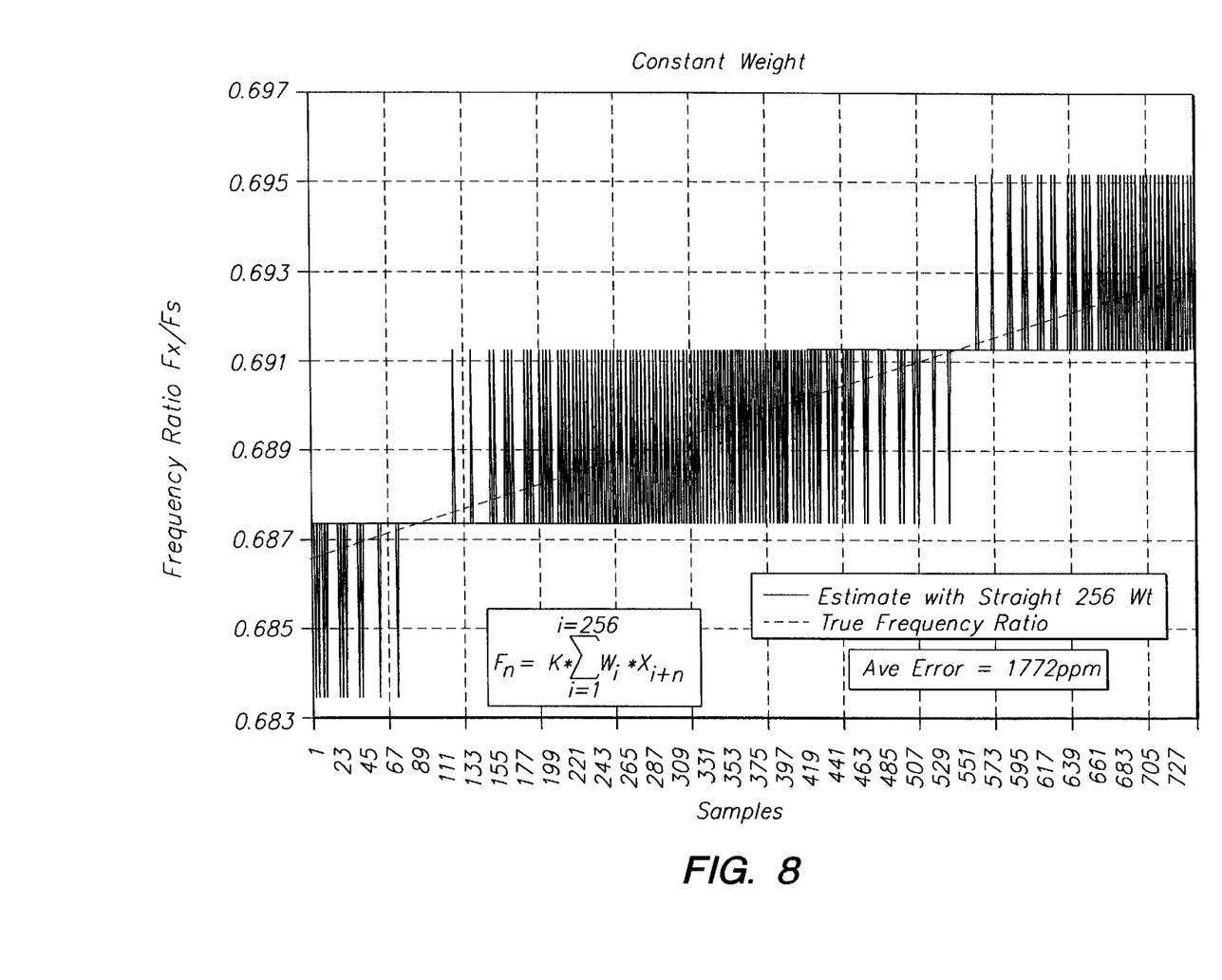
FIG. 8 is a graph illustrating the accuracy obtained from a digital frequency discriminator using a constant weighting function.
Figure 9:
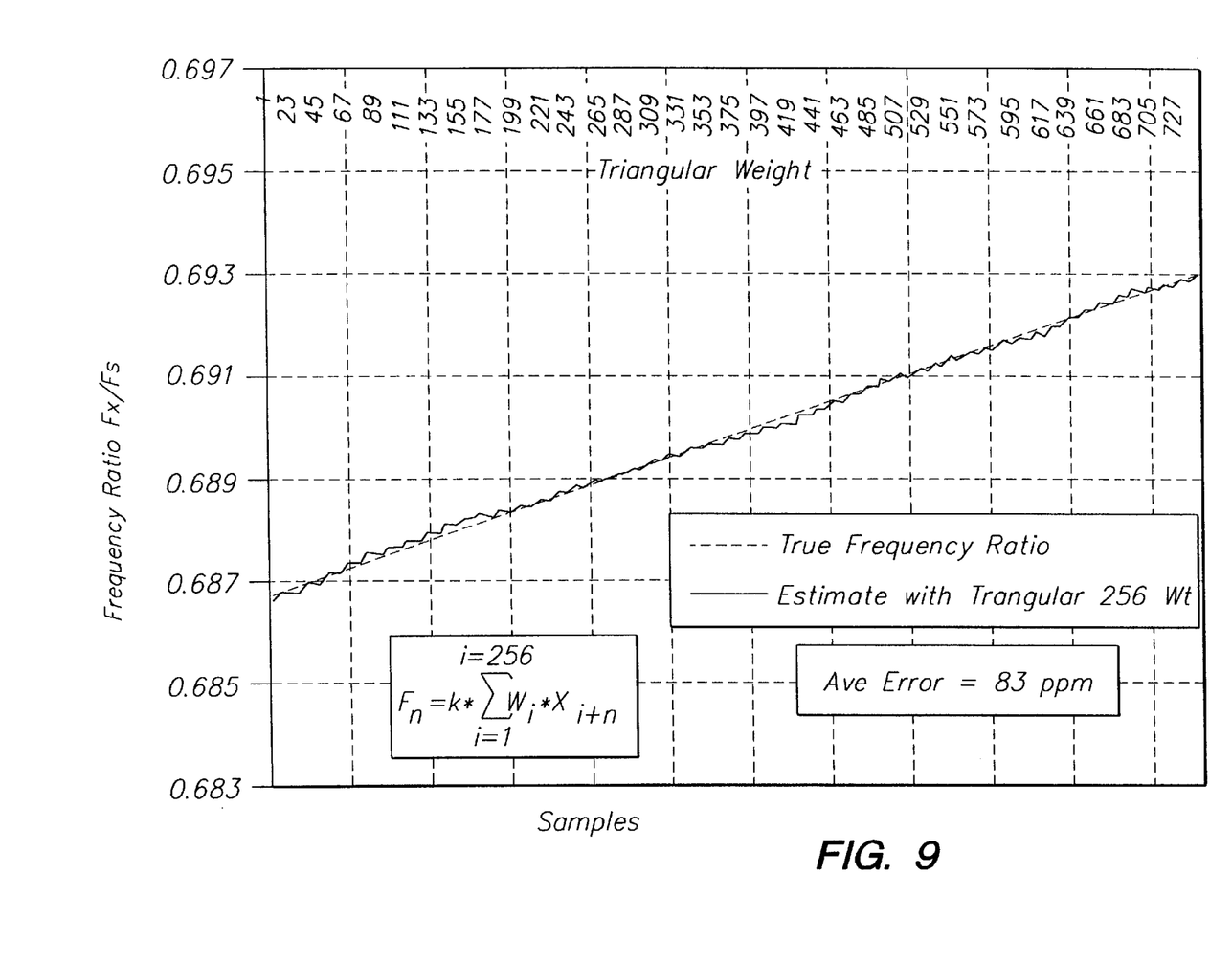
FIG. 9 is a graph illustrating the accuracy obtained from a digital frequency discriminator using a triangular weighting function.

Results of digital filtering using the straight-line weighting function and the triangular weighting function respectively, are shown in FIG. 8 and FIG. 9. In the case of both FIG. 8 and FIG. 9, the frequency ratio was increased from just under 0.687 to just over 0.693. As seen in FIG. 8, using a straight-line weighting function, the quantized signal oscillates between two levels that are adjacent to the input in such a manner that its local average equals the average input. The average error was calculated to be 1772 ppm. As seen in FIG. 9, using a triangular weighting function, the quantized signal tracks the input with an average error of 83 ppm.

Figure 10:
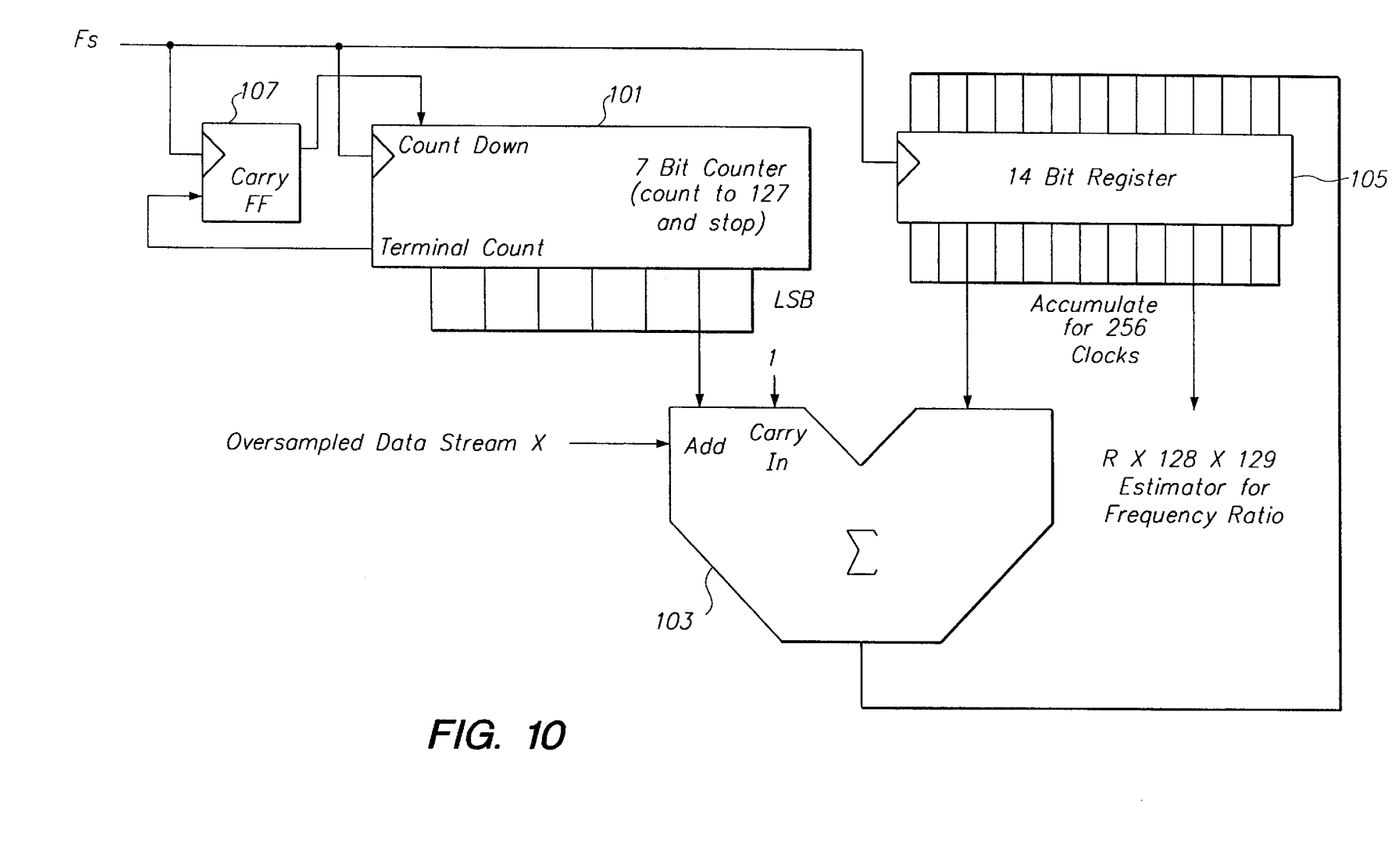
FIG. 10 is a block diagram of one example of a digital filter that may be used in conjunction with a frequency sampling circuit such as that of FIG. 4.

A schematic diagram of an exemplary frequency accumulator that applies a triangular weighting function and that may be used to accomplish the desired digital filtering is shown in FIG. 10. In the example shown, the frequency accumulator uses a 7-bit counter 101, a 14-bit adder 103 and a 14-bit register 105. The 7-bit counter is clocked by the sample frequency Fs. The output of the 7-bit counter is provided to one input of the adder. The function of the 7-bit counter is to count up from 0 to 127 and then down from 127 to 0. The count of 127 occurs twice in succession. This behavior is achieved using a flip-flop 107. The flip-flop is clocked by the sample frequency Fs. A Terminal Count signal of the 7-bit adder is input to the flip-flop. The output of the flip-flop is coupled to a Count Down input of the 7-bit counter.

The "oversampled" data stream is coupled to a control input of the adder. When the current bit of the data stream is a 1, an addition is performed. When the current bit is a 0, no addition is performed. A Carry In input of the adder is tied high, effectively causing the range of weights to be 1 to 128.

The 14-bit register is clocked by the sample frequency Fs. Its output is applied to the other input of the adder. Its input receives the output word produced by the adder. The function of the 14-bit adder is to perform an accumulation operation for 256 clocks. At the conclusion of the 256 clocks, the output of the 14-bit adder is used as an estimator for the frequency ratio. More particularly, in the example shown, the output of the accumulator is equal to R×128× 129, where R is the frequency ratio estimator.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed:

1. A method of determining a ratio of frequencies of a first clock signal and a second clock signal comprising:

sampling the first clock signal in accordance with the second clock signal to produce a stream of digital bits or symbols wherein a frequency ratio of the first and second clock signals is variable throughout a range including non-integer values; and performing postprocessing of the stream of digital bits or symbols to form, from a substantial number of said digital bits or symbols, a digital word indicative of the ratio of frequencies;

wherein each digital bit or symbol of a sequence of consecutive digital bits or symbols represents a number of transitions n of a predetermined polarity of the first clock signal that occurred during a corresponding period in a sequence of consecutive periods of the second clock signal where n is a non-negative integer.

2. The method of claim 1, wherein forming the digital word comprises filtering the digital bits or symbols.

3. An apparatus for determining a ratio of frequencies of a first clock signal and second clock signal comprising:

means for sampling the first clock signal in accordance with the second clock signal to produce a stream of digital bits or symbols wherein a frequency ratio of the first and second clock signals is variable throughout a range including non-integer values; and means for performing postprocessing of the stream of digital bits or symbols to form, from a substantial number of said digital bits or symbols, a digital word indicative of the ratio of frequencies;

wherein each digital bit or symbol of a sequence of consecutive digital bits or symbols represents a number of transitions n of a predetermined polarity of the first clock signal that occurred during a corresponding period in a sequence of consecutive periods of the second clock signal, where n is a non-negative integer.

4. The apparatus of claim 3, wherein said means for forming comprises a digital filter.

5. The apparatus of claim 4, wherein the digital filter employs a weighting function in which different weights are applied to different digital bits or symbols.

6. A circuit for producing a data stream indicative of a ratio of frequencies of two clock signals comprising a first input terminal to which a first clock signal is applied, a second input terminal to which a second clock signal is applied, and producing as an output signal a stream of digital bits or symbols wherein a frequency ratio of the clock signals is variable throughout a range including non-integer values, each digital bit or symbol of a sequence of consecutive digital bits or symbols representing a number of transitions n of a predetermined polarity of the first clock signal that occurred during a corresponding period in a sequence of consecutive periods of the second clock signal, where n is a non-negative integer, such that further processing of the stream of digital bits or symbols yields a digital word, formed from a substantial number of said digital bits or symbols, representing the ratio of frequencies.

* * * * *